United States Patent Office 3,758,306

Patented Sept. 11, 1973

3,758,306

PHOTOPOLYMERIZABLE COMPOSITIONS AND ELEMENTS CONTAINING ORGANOSILANES

Leo Roos, New Shrewsbury, N.J., assignor to E. I. du Pont de Nemours and Company, Wilmington, Del.

No Drawing. Filed Mar. 25, 1971, Ser. No. 128,191

Int. Cl. G03c 1/68

U.S. Cl. 96—83 10 Claims

ABSTRACT OF THE DISCLOSURE

Photopolymerizable elements having improved adherence to a substrate, e.g., a metal, glass, or organic polymer film of a layer of an ethenically unsaturated photopolymerizable monomer and a macromolecular organic polymer binder, preferably a polyacrylate or methacrylate containing a small amount of an organosilane. The organosilane may be an alkyl, vinyl, or aryl, trialdoxy, trichloro, or trihydroxy silane or a condensed, polymeric silane. The organosilane can be admixed with the photopolymerizable composition just prior to coating it onto the substrate. The elements can be used to make printed circuit boards.

BACKGROUND OF THE INVENTION

Field of the invention

This invention relates to improving adhesion of addition-polymerizable ethylenically unsaturated monomer to substrates. In particular, it relates to improving the adherence of poly(alkyl methacrylate) monomer compositions to inorganic substrates by the addition of small amounts of certain adhesion promoting agents to the photopolymerizable monomer composition. The invention may be usefully employed in the art of printed circuit manufacture or similar photofabricating systems wherein a panel comprising a substrate, e.g., a synthetic material or metal sheet having a photopolymerizable layer laminated thereon is printed and etched prior to use.

DESCRIPTION OF THE PRIOR ART

Photopolymerizable layers useful for the preparation of resist-forming elements of this invention are disclosed in U.S. patents: Plambeck 2,760,863, Aug. 28, 1956, and Celeste 3,469,982, Sept. 30, 1969. The layers do not always have adequate adherence to a substrate. Methods of improving adhesion by treating a metal surface with a solvent-soluble, further curable, organopolysiloxane from which the solvent is evaporated are taught in Burzynski, U.S. Pat. 3,460,980, Aug. 12, 1969. Treatment of deoxidized copper surface with a gamma-aminopropyltriethoxysilane solution to promote the cure of a polyester adhesive prior to etching is taught in Origer et al., U.S. Pat. 3,508,983, Apr. 28, 1970. These methods are beneficial, but require additional steps.

In the present invention, the adhesion of photopolymerizable compositions to various substrates is significantly improved, when small quantities of particular silicon containing compounds are directly incorporated in the photopolymerizable composition.

SUMMARY OF THE INVENTION

Accordingly, it is the object of this invention to provide a new and improved method of improving the adhesiveness of photopolymerizable compositions applied to conventional substrates. A further object is to provide a method of increasing the wettability of the compositions to facilitate coating. Another object is to provide preformed, photopolymerizable resist films which remain durable, when applied to various workable substrates, which may be bent or stamped. A still further object of this invention is to provide a method of eliminating conventional conditioning of substrates to render them more adherent where improved adhesion of a methyl methacrylate type resin composition is necessary or desirable. Briefly stated, the present invention contemplates the preparation of a photoresist composition having an improved adhesion to various surfaces in which a bond impervious to atmospheric moisture and appreciably resistant to corrosion is effected upon polymerization. Still further objects will be apparent from the following description of the invention.

The photopolymerizable layers of the invention comprise 10–90 parts of a thermoplastic macromolecular organic polymer binder which is stable at 50° C., e.g., with 90–10 parts, by weight, of at least one ethylenically unsaturated monomer having at least two terminally unsaturated groups, and an initiating amount, e.g., 0.1–5%, of an addition polymerization initiator, activatable by actinic light; characterized by the presence initially of 1–15% of a monomeric or polymeric silane, the percentages being by weight and based on the total weight of the binder and monomer.

PREFERRED EMBODIMENTS

The monomeric silanes useful in accordance with this invention have the formula:

$$R_mSiX_n$$

wherein R may be a phenyl group or an alkyl group having 1 to 12 carbon atoms which may be unsaturated or saturated, e.g., a vinyl or substituted vinyl group, e.g., vinyl-tri-gamma-methacryloxypropyl, beta - (3,4 - epoxycyclohexyl)ethyl, gamma - glycidoxypropyl, gamma-mercaptopropyl, or an amino-substituted radical, e.g., gamma-aminopropyl, and N - beta-(aminoethyl)-gamma-aminopropyl, X is an alkoxy group having 1 to 4 carbon atoms, e.g., methoxy through n-butoxy and such mixed alkoxys, e.g., 2-methoxyethoxy, or a halogen, e.g., Br or Cl, preferably Cl. Subscripts *m* and *n* are integers from 1 to 3 whose sum is 4 or, at times, *n* is 3, when X is Cl and *m* is 0. In those instances wherein R is unsaturated or substituted and *m* is 2 or 1, X may be a di- or trihalo or any of the aforementioned groups, e.g., vinyltrichloro, phenyltriethoxy, vinyl-tri-(2 - methoxyethoxy), gamma-methacryloxypropyltrimethoxy, beta-(3,4-epoxy cyclohexyl) ethyltrimethoxy, gamma - glycidoxypropyltrimethoxy, gamma-mercaptopropyltrimethoxy, gamma - aminopropyltriethoxy, N - beta(aminoethyl)-gamma-aminopropyltriethoxy, silanes. In addition to these compounds which may be directly incorporated in the photopolymerizable composition, those having monomeric structures may be condensed with ethylenically unsaturated polymers to form organopolysilanes or siloxanes for use with the resist composition to promote adhesion and wettability thereof.

Preferred polymeric compounds adapted for use in the subject invention are the oligomeric or polymeric condensed silanes and vinyl or copolymerized silanes or homopolymers produced by the hydrolysis and condensation of at least one silicon containing component or silane of the general formula:

$$R_1Si(X)_n$$

wherein $R_1$ is an aryl or unsaturated, aliphatic group having from 2 to 12 carbon atoms of which the hydrogen atoms thereof may be substituted by an epoxy, an amino or a mercaptoalkyl group, X may be of the same values stated above, and $n$ is primarily 3. Suitable components of this type which are useful in the prescribed manner are vinyltrichloro-, phenyltriethoxy, gamma-glycidoxypropyltrimethoxy, beta - (3,4-epoxycyclohexyl)ethyltrimethoxy, gamma-aminopropyltriethoxy, gamma-mercaptopropyltrimethoxy, N - beta-(aminoethyl)-gamma-aminopropyltrimethoxy silanes, etc.

Suitable polymers for making the condensed silanes are the macromolecular organic polymers, including copolymers, having pendant acid or hydroxyl groups. Specific copolymers are those essentially comprising 90 mole percent polymethylmethacrylate and 10 mole percent methacrylic acid, and poly(vinyl chloride)/poly(vinyl acetate).

In the preparation of a preferred polymeric silane and copolymer condensate approximately 0.4 to 0.6 gram of a suitable organosilane is admixed with 40 to 60 grams of a suitable copolymer under moderate stirring at 25 to 200° C. for ½ to 24 hours prior to incorporation into the photoresist composition.

The functional silane or siloxane is condensed with the copolymerizable compounds through the functional group or groups and the silicon atom to render the photo-resist composition more adherent to the substrate, yet remain moderately adherent to materials which are eventually delaminated therefrom.

In practicing the embodiments of the invention, a silane or polysilane, as described above, is admixed with the photopolymerizable composition in an amount of 0.5–15%, by weight, based on the total weight of the composition. Suitable resist-forming photopolymerizable compositions may be of the type taught in assignee's Celeste, U.S. Pat. 3,469,982 or any similar adhesion dependent photopolymerizable element.

Various photopolymerizable compositions with which the prescribed components may be admixed to facilitate adhesion to a substrate, among others, are the compositions described in Plambeck, U.S. Pat. 2,760,863, and Martin, U.S. Pat. 2,927,022. Other useful photopolymerizable compositions may be those described and listed in Kitson, U.S. Pat. 3,129,098, Apr. 14, 1964.

The elements of the invention are useful for making photoresists with improved adhesion to metal or other surfaces, including glass and ceramic surfaces by a process comprising:

(1) adding a silane or siloxane compound in the prescribed amount to a photopolymerizable composition, and coating it on a film support,
(2) applying the photopolymerizable layer having a thickness of at least 0.0001-inch with low to moderate adhesion to a thin, flexible, polymeric film-support (e.g., 0.0025–0.008 inch or more) preferably with heating or later heating to from 40° C. to about 150° C. to a suitable surface then in either order,
(3) exposing the layer, imagewise, to actinic radiation to form a resist image of polymerized material,
(4) stripping the film support from the resulting image bearing layer,
(5) washing away the unexposed areas of the layer to form a resist image or polymeric material, and
(6) permanently modifying the adjacent areas on said surface which are unprotected by the resist image by using a reagent capable of etching said areas or depositing a material on said areas.

The invention will be further illustrated by, but is not intended to be limited to, the following detailed examples.

EXAMPLE I

A preferred photopolymerizable resist composition comprising the following ingredients was prepared:

| Ingredient: | Amount, g. |
|---|---|
| Trichloroethylene | 6000 |
| Poly(methyl methacrylate) (molecular wt. 30,000) | 578 |
| Poly(methyl methacrylate) (molecular wt. 60,000) | 220 |
| Terpolymer of γ-methacryloxypropyltrimethoxy silane, methyl methacrylate and methacrylonitrile (molecular wt. 12,000) | 95.0 |
| Trimethylolpropane triacrylate | 835 |
| 2 - o - chlorophenyl-4,5-bis(phenyl)imidazoyl-yl dimer | 24 |
| 7-diethylamino-4-methylcoumarin | 9.0 |
| 2-mercaptobenzothiazole | 9.0 |

To the above ingredients, there was added additional trichloroethylene to make the total weight 10,000 g. The ingredients were thoroughly mixed by moderate stirring for 24 hours. The resulting composition was then skim-coated onto a 0.001-inch thick polyethylene terephthalate transparent support film to a dried thickness of about 0.00035-inch and then, using a rubber pressure roller at 55–60° C., laminated to the dried layer a 0.001-inch thick polyethylene cover film. At this point, the film may be stored for later use.

The cover film was removed from the opposite photopolymerizable element and there was laminated to the bare surface a boron doped silicon wafer having a 12,000 A.-thick silicon dioxide layer thereon. This lamination was carried out under roller pressure at 120° C. The resulting laminated film element comprising the polyethylene terephthalate film and the silicon wafer, having interposed therebetween the sensitized photopolymerizable composition, may be stored in this form for later use. But in this instance, the side of the element having the transparent film was exposed through a suitable image at a distance of 25 inches for 3 seconds to a 500-watt high-pressure mercury arc. Following exposure, the film was peeled off and discarded leaving the resist adhered to the wafer. The wafer was held for one-half hour at room temperature, developed for 15–30 seconds in 1,1,1-trichloroethane and then rinsed with water for 1 minute to remove the unexposed areas of the resist. The image-bearing wafer was then blown dry and placed in an oven at 150° C. for 10 minutes. Upon cooling, the exposed doped silicon wafer was etched away with an etchant comprising 680 ml. of water, 164 ml. of concentrated hydrofluoric acid approximately 50 percent and 454 g. of ammonium fluoride at a rate of 1000 A. per minute. Shortly thereafter the resist was removed with a 90:10 vol. methylene chloride and methanol solution. When compared with a control element having a resist composition without the above described terpolymer but prepared and processed in a similar manner, the element showed much greater quality in adhesion, line definition and resistance to undercutting. Unlike the control element, wherein adhesion was poor and undercutting had occurred, the subject element had excellent quality throughout.

EXAMPLE II

A photopolymerizable composition comprising the following ingredients was prepared:

| Ingredient: | Amount |
|---|---|
| Poly(methyl methacrylate) (molecular wt. 30,000), g. | 4.0 |
| Poly(methyl methacrylate) (molecular wt. 60,000), g. | 1.5 |
| Triethylene glycol diacetate, g. | 8.0 |
| Trimethylolpropane triacrylate, g. | 4.0 |
| 1% 2-tertiary-butylanthraquinone in methanol, ml. | 6.0 |
| 2,2′-dihydroxy-4-methoxybenzophenone, ml. | 1.0 |
| Methylene chloride to make 160.0 g. | |

The above ingredients were thoroughly admixed and equally divided into three parts, A, B, and C. To part A there was added, under moderate stirring, 0.5 ml. of γ-methacryloxypropyl trimethoxy silane. To part B there was added 0.5 ml. of an active primer, and an amine-containing silane of approximately 47.0% solids in ethanol (AP–133 Union Carbide). Using part C without a silane or silicone primer as a control, the solutions were coated with a 2-mil coating knife on strips of .001 inch thick polyethylene terephthalate. The coated films bearing a 0.4 mil photopolymerizable layer, when dried were then laminated at 100° C. to a 1¼ inch diameter silicon wafer of 5 to 10 mil thickness and doped with boron to give an N type semi-conductor having a resistance of 1 to 3 ohms per cm. and covered with a 1,1,1 oxide layer of 12,500 A. thickness, and the exposed element was developed by a 20 second spray of methyl chloroform followed by a 1 minute spray of de-ionized water, baked at 180° C. for 5 minutes, and etched in a buffered hydrofluoric acid solution consisting of 4 moles of ammonium fluoride and 1 mole of hydrofluoric acid solution in 680 ml. of water for 14 minutes. In this instance the etching rate was 1000 A. per minute. Following a thorough rinsing, it was observed, unlike the control, the compositions having siliceous adhesion promoters did not undercut the resist.

EXAMPLE III

Similar results to that discussed above were obtained, when 0.5 grams of vinyltriethoxy silane were substituted for the $\gamma$-methacryloxy-propyl-trimethoxy silane in A and compared with C.

EXAMPLE IV

A photopolymerizable composition comprising the following ingredients was prepared:

| Ingredient: | Amount, g. |
|---|---|
| Poly(methyl methacrylate) (M.W. 30,000) | 30.5 |
| Poly(methyl methacrylate) (M.W. 60,000) | 11.1 |
| Dimethylpolysiloxane with vinyl groups + 20% by wt. fillers, sp.gr. 1.10 at 25° C. | 5.0 |
| Trimethylolpropane triacrylate | 44.1 |
| Triethylene glycol diacetate | 7.1 |
| 2 - o - chlorophenyl - 4,5-bis(phenyl)imidazole dimer | 1.26 |
| 2-mercaptobenzothiazole | .45 |
| 7-diethylamino-4-methylcoumarin | .45 |
| Trichloroethylene to make 650.0 g. | |

The above described composition was thoroughly mixed under moderate stirring. Using a similar composition without the siloxane as a control, the photopolymerizable composition was skim-coated on 0.001-inch polyethylene terephthalate film and dried at 160° F. to give a coating thickness of about 0.00035-inch. A .001-inch polyethylene cover film was then laminated to the dried coating using a rubber covered heated, pressure roller at 60° C. to protect the photopolymerizable stratum during storage until transfer to a final support. In this instance transfer occurred within several hours, however, such sandwich elements may be conveniently stored for longer periods in chop or roll stock form.

The cover film was removed from the composite photopolymerizable element, and the bared resist coating having the polyethylene terephthalate support remaining contiguous thereto was laminated to an untreated silicon wafer. Lamination was affected by use of rubber covered rollers operating at 120° C. with a pressure of 3 pounds per lineal inch at the nip, at a rate of 2 feet per minute. The resulting sensitized elements comprising the silicon wafers and polyester supports having the photopolymerizable stratum contiguously interposed therebetween may be stored for later use. The elements (with its polyester film still intact) were then exposed to a 1000-watt Sylvania SG–60 Sungun for 7 seconds through a transparency at a distance of 16 inches. Upon exposures, the polyester supports were removed leaving the exposed resist adherent to the silicon wafers. The exposed elements were then spray developed with 1,1,1-trichloroethane and baked for 10 minutes at 150° C. The resulting elements were then subjected to a 12 minute treatment with a solution containing 164 ml. of an 8% hydrofluoric acid and 454 g. of ammonium fluoride in 680 ml. of water to etch those areas not covered by the resist. Shortly thereafter, the etched element was rinsed and then dipped into a standard potassium dichromate and sulfuric acid solution at 100° C. to facilitate removal of the cover film.

It was observed there was severe undercutting concomitant with loss of image due to poor adhesion in the control element. But image quality and adherence of the resist to the support was excellent with less than 1 percent undercut in the element having the siloxane incorporated therewith.

EXAMPLE V

An experiment designed to evaluate the adhesive properties of a conventional, ethylenically unsaturated photopolymer composition having an organopolysilane therein was conducted as follows:

To 200 ml. of dry benzene contained in a 500-ml. flask equipped with magnetic stirrer, thermometer and nitrogen inlet fixture, there was added 15 g. of a 90:10 mole percent polymer of methylmethacrylate with hydroxy-ethylmethacrylate. The solution was treated for 1 hour under nitrogen atmosphere in a reflux condenser having a Dean Stark trap to remove water. Then the solution was cooled to room temperature (20° C.), whereupon there was added 5 ml. of vinyltriethoxy silane and 2 drops of pyridine. The solution was moderately stirred for 48 hours, and the polymer was precipitated with ligroin. The polymeric condensed silane precipitated therefrom was a rubbery substance having an IR absorption reading of 1140 $cm.^{-1}$ or 9.6$\mu$ assignable to the Si—O in the condensed silane. The silane was suitable for incorporation into a photopolymerizable resist-forming composition comprising the following ingredients:

| | Grams |
|---|---|
| Poly(methyl methacrylate) (M.W. 30,000) as 25% solution | 768 |
| Poly(methyl methacrylate) (M.W. 60,000) as 20% solution in triclene | 240 |
| Triethyleneglycol diacetate | 32 |
| Trimethylolpropane triacrylate | 192 |
| 2-tertiary-butylanthraquinone | 0.3 |
| 4,4′-bis(dimethylamino)benzophenone | 0.3 |
| Trichloroethylene to make 2000.0 ml. | |

The photopolymerizable solution was thoroughly mixed and shortly thereafter there was added to 350 g. of the solution 4 g. of the condensation polymeric silane prepared as described above. Using a doctor blade having a spacing of .0002″, the resulting solution was coated on a strip of 0.001-inch thick polyethylene terephthalate to a dry thickness of .004 inch. A clean silicon wafer was then laminated thereto at 100° C., held for 2 minutes, and exposed through a photographic negative to a 500-watt high pressure mercury arc at a distance of 16 inches for 20 seconds and held for 10 minutes. The polyethylene terephthalate cover film was removed from the composite photopolymerized element leaving the exposed resist adherent to the wafer. The wafer was then developed for 5 seconds in a solution of methyl chloroform. It was then baked for 10 minutes at 150° C. and etched for 13 minutes at room temperature in a hydrofluoric acid solution. The etched element when washed in water, swabbed, rinsed again and dried, yielded a clean image without undercutting and was useful for micro-circuitry.

EXAMPLES VI–XVI

Additional condensates of silane monomers and ethylenically unsaturated polymers were prepared for evaluation when incorporated in a representative photoresist solution. In this instance, sufficient quantities of two photoresist solutions, A and B, similar to those described in assignee's Celeste, U.S. Pat. 3,469,982 were prepared, and the respective controls were removed from each solution. Said photoresist solutions essentially comprised the following:

| Ingredients | Solutions and amounts in grams * A | B |
|---|---|---|
| Poly(methyl methacrylate) low M.W. | 42.0 | 61.0 |
| Poly(methyl methacrylate) high M.W. | 14 | 22.2 |
| Trimethylolpropane triacrylate |  | 88.2 |
| 2-tertiary-butylanthraquinone | 3.5 |  |
| 4,4'-bis(dimethylamino)benzophenone |  | 1.0 |
| Benzophenone |  | 1.0 |
| 2-2'-methylene bis(4,ethyl-6-tert-butylphenol) | 0.35 |  |
| Methanol |  | 50.0 |
| Victoria (pure) Blue B.O. (C.I. 42595) | .15 |  |
| Methylene chloride to make | 230.0 | 1,200.0 |

Various resist compositions consisting of 50 grams of the above described A or B solution and a prescribed amount of a polymeric silane condensate were prepared. Those compositions employing solution A had 0.5 g. of a silane condensate added thereto and were coated onto .001-inch thick polyethylene terephthalate film with a .006 inch knife coater opening and dried at ambient conditions to a thickness of about .0005 inch. The coated material was then laminated in the aforementioned manner at 110° C. onto phenolic resin-based copper having a clean surface which had been cleaned with pumice and rinsed. The resultant photoresist covered elements were then exposed to a nuArc Carbon Arc through a line transparency for 2 minutes, the polyester film removed, and adequately developed in an automatic developer using a methyl chloroform solution. Shortly thereafter the elements were copper plated in a standard copper-pyrophosphate bath.

Those resist compositions essentially comprising about 50 g. of solution B having 0.5 g. of a polymeric silane condensate therein, similar composite plate elements were prepared, except zinc and magnesium plates and silicon wafers were used in place of the phenolic based copper. Exposure and development operations were repeated according to the aforementioned method, but in this instance the zinc and magnesium substrates bearing the resist images were treated for 3 minutes in a 10% $HNO_3$ until the surface not covered by the resist had been etched away. The silicon wafer was etched in an ammonium fluoride and hydrofluoric acid solution similar to that disclosed in Example I for 12 minutes. The respective controls were processed in a similar manner. The adhesion was measured as a function of undercutting, resolution and definition for the zinc and magnesium samples and as undercutting and resist lift in the instances of the silicon samples. In all instances, image quality was good and adhesion results obtained therefrom were as follows:

EXAMPLES XVII–XXVI

A sufficient quantity of a stock solution required to make 13 samples in the amount set forth was made comprising the following:

| | Grams |
|---|---|
| Poly(methyl methacrylate) M.W. 30,000 | 30.5 |
| Poly(methyl methacrylate) M.W. 60,000 | 11.1 |
| Trimethylolpropane triacrylate | 44.1 |
| Triethyleneglycoldiacetate | 7.1 |
| 2-o-chlorophenyl-4,5-diphenylimidazolyl dimer | 1.26 |
| 2-mercaptobenzothiazole | .45 |
| 7-diethylamino-4-methyl coumarin | .45 |
| Trichloroethylene to make 650.0 g. | |

To each of 6 solutions there was admixed 5.0 g. of an organopolysilane from a monomeric silane given in the table below. Duplicate samples were also prepared for later applications.

Following adequate stirring, all of the 11 solutions were coated onto two .00075-inch-thick polyethylene terephthalate film strips to give a coating thickness of about 0.0004-inch, when dried at 25° C. for 60 minutes. Then the dried coatings were laminated onto silicon wafers using a rubber pressure roller at 110° C.

In a similar manner the balance of the film strips bearing the dried photopolymerizable elements were laminated onto 0.010-inch-thick red dyed and sealed anodized aluminum sheets which had been cleaned in trichloroethylene vapor in a degreasing chamber.

Then the sensitized elements were exposed for 10 seconds to a Sylvania SG–60 1000 watt Sungun at 16 inches through a transparency having an opaque tint image on a clear background.

Following exposure, the polyester support films were peeled from the silicon wafer and aluminum supports leaving the photoresist layers adhered to the respective silicon or aluminum substrates. Immediately thereafter, the exposed elements were then developed in methylchloroform and baked for 10 minutes at 150° C. Said silicon based elements were then etched by immersion in a hydrofluoric acid and ammonium fluoride solution similar to that disclosed in Example I; washed in water, swabbed with a sponge, rinsed again and dried. The aluminum based elements were etched in 10% sodium hydroxide solution at 50° C.

Using the element bearing the image obtained from the unmodified stock solution as a control, the remaining elements were compared thereto for image quality and adhesive properties of the particular modified photoresist to the substrate. In addition to undercutting and resist lift-off, resolution of the aluminum supported samples was of particular concern. In all instances these properties and image quality were good.

| Sample | Substrate | Resist composition | Organopolysilane: Polymer | Organopolysilane: Silane monomer | Adhesion |
|---|---|---|---|---|---|
| VI | Zinc | A | MMA/MAA* (9:1) | Gamma-glycidoxypropyltrimethoxy-silane. | Excellent. |
| VII | do | A | MMA/MAA (9:1) | Beta-(3,4-epoxy cyclohexyl) ethyl trimethoxy silane. | Do. |
| VIII | do | A | MMA/MAA (9:1) | Gamma-aminopropyltriethoxy silane | Do. |
| IX | do | A | MMA/MAA (9:1) | N-beta-(aminoethyl)-gammaamino-propyltrimethoxy silane. | Do. |
| X | do | A | MMA/MAA (9:1) | do | Do. |
| Control | do | A | MMA/MAA (9:1) | | Fair with undercutting. |
| XI | Magnesium | B | MMA/MAA (9:1) | do | Excellent. |
| XII | do | B | MMA/MAA (9:1) | N-beta-(aminoethyl)-gammaamino-propyl-trimethoxy silane ethyltrichloro silane. | Excellent. |
| XIII | do | B | MMA/MAA (9:1) | | Do. |
| XIV | do | B | MMA/MAA (9:1) | Amyltriethoxy silane | |
| XV | do | B | MMA/MAA (9:1) | Vinyl tris(2-methoxyethoxy) silane | Excellent. |
| XVI | do | B | Poly(vinylchloride) acetate, inherent viscosity=0.54. | Gamma-aminopropyltriethoxy silane | Excellent. |
| | | B | Poly(amide) | Gamma-methacryloxypropyltri-methoxy-silane. | Do. |
| Control | do | B | | | Poor. |

*Methyl methacrylate/methacrylic acid.

The compounds condensed to make the various organopolysilane condensates and the respective adhesion characteristics obtained therefrom are set forth below:

| Sample | Substrate | Organopolysilane condensate: Polymer | Organopolysilane condensate: Silane monomer | Adhesion |
|---|---|---|---|---|
| XVII | Silicon | (MMA/MAA)[1](9:1) | Gamma-glycidoxypropyltrimethoxy | Very Good |
| XVIII | do | MMA/MAA (9:1) | Beta-(3,4-epoxycylohexyl)ethyltrimethoxy. | Do. |
| XIX | do | MMA/MAA (9:1) | Gamma-aminopropyltriethoxy | Do. |
| XX | do | MMA/MAA (9:1) | N-beta-(aminoethyl)-gamma-aminopropyltrimethoxy. | Do. |
| XXI | do | MMA/MAA (9:1) | Vinyltrimethoxy | Do. |
| Control | do | | | Undercut. |
| Do | Aluminum | | | Do. |
| XXII | do | MMA/MAA (9:1) | Same as XVII | Very Good. |
| XXIII | do | MMA/MAA (9:1) | Same as XVIII | Do. |
| XXIV | do | MMA/MAA (9:1) | Same as XIX | Do. |
| XXV | do | MMA/MAA (9:1) | Same as XX | Do. |
| XXVI | do | MMA/MAA (9:1) | Same as XXI | Do. |

[1] Methyl methacrylate methacrylic acid.

EXAMPLES XXVII–XXXI

A sufficient quantity of a photopolymerizable solution into which various condensed polymeric silanes were to be incorporated to evaluate the adhesive properties thereof was prepared from the following ingredients:

| | Grams |
|---|---|
| Poly(methyl methacrylate) (M.W. 30,000) as 25% solution in trichloroethylene | 22 |
| Poly(methyl methacrylate) (M.W. 60,000) | 10 |
| Trimethylolpropane triacrylate | 37 |
| Triethylene glycol diacetate | 6 |
| 2-t-butylanthraquinone | .2 |
| 4,4′-bis(dimethylamino)benzphenone | .2 |
| Trichloroethylene to make 700.0 g. | |

To each of four containers having a solution similar to that described above there was added 15 g. of a condensed organopolysilane as specified below. Said solutions were thoroughly mixed, coated on .001 inch polyethylene terephthalate strips, and laminated to polyethylene cover sheets. Using a photopolymer solution similar to above described composition without a polymeric silane as a control, the exposed elements were processed in the manner disclosed in Examples V–XV and compared.

| Organopolysilane condensate of— Polymer | Silane monomer | Adhesion |
|---|---|---|
| Poly(methyl methacrylate/ methyl methacrylate/methacrylic acid) [1] (90:10 mole percent). | Vinyltrichlorosilane | Good. |
| PMA/MAA | Phenyltrimethoxy silane | Do. |
| PMA/MAA | Gamma-glycidoxy-propyltrimethoxysilane. | Do. |
| PMA/MAA | Gamma-aminopropyltriethoxy silane. | Do. |

[1] PMA/MAA with 10 mol percent β-hydroxyethyl methacrylate.

EXAMPLE XXXII

An experiment designed to evaluate the effectiveness of a graft copolymeric silane as an adhesion promotor in a photoresist composition, when applied to a zinc substrate was conducted as described below.

A graft copolymer of the type embodying this invention was prepared as follows:

A 1-liter, 3-neck flask equipped with a stirrer, gas inlet tube, thermometer, reflux condenser with a Dean Stark trap and heating mantle was charged with 15 g. of a poly (vinyl chloride)/poly(vinyl acetate)copolymer FFF Grade resin of med. mol. wt. within sp. gr.=1.5 and 600 ml. of toluene. This mixture was then refluxed under nitrogen for 2 hours to remove any water therefrom by azeotropic distillation. Shortly thereafter 5 g. of γ-methacryloxy propyltrimethoxy silane and 1 g. of azo-bis-isobutyronitrile were added to the mixture. Upon refluxing for 6 hours under nitrogen, cooling and the addition of hexane, a white, powdery, polymeric precipitate was obtained from the reaction vessel. Said white powdery precipitate was then prepared for use in a photopolymeric resist composition comprising the following:

| Ingredients: | Grams |
|---|---|
| Poly(methyl methacrylate) low M.W. | 61.0 |
| Poly(methyl methacrylate) medium M.W. | 22.2 |
| Trimethylolpropane triacrylate | 88.2 |
| Triethyleneglycol diacetate | 14.2 |
| 4,4′-bis(dimethylamino)benzophenone | 1.0 |
| Benzophenone | 1.0 |
| Methanol | 50.0 |
| Methylene dichloride to make 1200.0 g. | |

To 50 g. of this photopolymerizable composition, there was added 0.8 g. of the graft copolymeric silane prepared in the above described manner. The mixture was stirred for 2 hours and then coated to an approximate dry layer thickness of .0005-inch on .00075-inch thickness polyethylene terephthalate film and laminated with poly(propylene) cover film of .001-inch thickness. The poly(propylene) film was peeled off and then, using a press having rubber covered rollers, said film was laminated at 120° C. onto a zinc plate the surface of which had been pumiced, rinsed, and dried. The plate with the layer of resist-forming composition and a similar element wherien the silane had been omitted serving as a control were exposed for 35 seconds through a conventional negative to a nuArc carbon arc at a distance of 16 inches. After exposure, the polyester support films were peeled from the surface leaving the photoresist layers adhered to the zinc. The exposed elements were then developed for 30 seconds by dipping into methylchloroform and rinsing with water. The latitude in developer of the sample was far superior to that of the control. Shortly thereafter the areas of the image bearing elements not covered by the resist were etched by immersion of the plates in a 10% $HNO_3$ solution for 3 minutes. Upon washing in water, swabbing, rinsing again, the dry etched plate wherein the silane had been used showed better definition and unlike the control there was no undercutting.

EXAMPLE XXXIII

A free-radical organopolysilane was prepared for use in a photoresist solution to improve adhesion as follows:

In a 12 liter, three-necked, round-bottom flask equipped with a stirrer, thermometer, gas inlet tube, condenser drying tube, and Dean Stark trap were placed 7000 ml. of sodium-dried benzene, 1200 g. of methylmethacrylate, 300 g. γ-methacryloxypropyltrimethoxy silane and 50 g. of acrylonitrile. When the addition was completed the well stirred mixture was refluxed under nitrogen for 2 hours, and all traces of water were distilled therefrom through the Dean Stark trap. Upon the addition of 30 g. of azo-bis-iso-butyronitrile to the solution, stirring and reflux operations were continued for 24 hours under ntirogen. Then about 3600 ml. of benzene was distilled from the solution under reduced pressure, and the remaining solution was cooled to room temperature at which point the same was mixed under rapid stirring with five-fold excess hexane.

The white-polymeric precipitate obtained therefrom, upon drying under vacuum, when tested in a 16% soltuion in benzene had a viscosity of 5.5 centipoise at 25° C. Using a Stabin-Shell osmometer with a 600-w. membrane, the molecular weight of said precipitate was determined at 11,600. A further chemical analysis indicated said precipitate comprised a polymeric silane of 88 methylmethacrylate/9 silane/11 acrylonitrile having 58.85% carbon, 7.84% hydrogen, 1.38% nitrogen, and 2.13% silicon and 19.80 percent oxygen. A portion of the 1483 g. yield of said polymeric silane was then set aside for use in a photoresist solution.

Approximately 250 g. of the compound prepared in the above described manner was incorporated in a photopolymerizable solution comprising the following:

| Ingredients: | Grams |
|---|---|
| Poly(methyl methacrylate) low M.W. | 1,055.0 |
| Poly(methyl methacrylate) medium M.W. | 440.0 |
| Trimethylolpropane triacrylate | 1,737.0 |
| Triethylene glycol diacetate | 250.0 |
| 4,4'-bis(dimethylamino)benzophenone | 8.5 |
| Benzophenone | 15.0 |
| Methylene chloride to make 25,000.0 g. | |

Using an untreated silicon wafer as a substrate, the thoroughly mixed solution was then coated, exposed and processed in the manner described in Example XXII. The image-bearing element obtained, had good image quality and excellent adhesion of the resist composition to the substrate.

EXAMPLE XXXIV

A terpolymer was prepared for use as an adhesion promoter in a photoresist solution similar to that disclosed in Example VII of assignee's Celeste, U.S. Pat. 3,469,982 as follows:

A 1-liter three-neck flask mounted on a heating mantel and equipped with a stirrer, gas inlet tube, and reflux condenser wtih a Dean Stark trap was charged with 700 ml. of benzene and 96 g. of methylmethylacrylate. The mixture was refluxed under nitrogen for 2 hours at which point there was added 24 g. of $\gamma$-methacryloxypropyltrimethoxy silane, 5 g. of diacetoneacrylamide and 1.4 g. of azo-bis-isobutyronitrile. This solution was refluxed overnight, and a white polymer was obtained therefrom. Said polymer which yielded the following analysis:

$$C=58.48\%,$$

H=8.27%, Si=1.94% and N=.47% was prepared for used in the following photoresist solution:

| Ingredients: | Grams |
|---|---|
| Poly(methyl methacrylate) low M.W. | 17.00 |
| Poly(methyl methacrylate) high M.W. | 6.3 |
| Pentaerythritol triacrylate | 19 |
| Triethylene glycol diacetate | 2.7 |
| 2-tertiary-butylanthraquinone | 2.6 |
| 2,2' - methylene bis(4 - ethyl - 6 - tert-butylphenol) | .3 |
| Victoria Pure Blue—B.O. (C.I. 42595) | .1 |
| Methylene chloride to make 350.0 g. | |

To this solution there was added under moderate stirring 1.5 g. of the above described terpolymer of methyl methacrylate, diacetone acrylamide and $\gamma$-methacryloxypropyltrimethoxy silane. Using a .002-inch opening knife the solution was then coated on .001-polyethylene terephthalate film to a dried thickness of .0004-inch. The resist bearing film was then laminated to a silicon wafer having a $SiO_2$ surface and exposed to a nuArc carbon arc for 2 minutes at a distance of 25 inches. The exposed element was then baked for 10 minutes at 150° C., and the non-resist bearing areas were etched in a standard hydrofluoric acid and ammonium fluoride solution, washed and rinsed. When the process resist element was dried, it was observed etch characteristics were excellent.

EXAMPLE XXXV

An additional quantity of the resist solution similar to that described in Example XXXIV was coated on a polyester strip which was then laminated to a clean copper clad board and exposed in the manner disclosed above. The polyester support film was peeled off, and the exposed resist layer was washed in methyl chloroform to remove the unexposed areas of the resist layer. In this instance the resist element was placed in a Pemco Etcher, Model #8/9 VR and etched with $FeCl_3$ solution for 3 minutes at 140° F. Etch characteristics were excellent and there was no undercutting or pinholing.

EXAMPLE XXXVI

Using the method described in Example XXXIV a terpolymer comprising methyl methacrylate, 2-methacryloxypropyltrimethoxy silane and acrylonitrile and having a molecular weight of 12,000 was prepared for use in a chrome photomask. In this instance 5.0% (based on the total weight of solution) of the polymeric silane was admixed with a stock photopolymer solution similar to that disclosed in the aforementioned example. The resulting solution was then coated onto a .00075-inch thickness polyethylene terephthalate film to a dried thickness of .0003 inch upon which there was laminated a .001 inch thickness polypropylene protective cover. Shortly thereafter using a Laminex® laminator said protective cover was removed, and the photopolymerizable resist coating was laminated at 110° C. to a substrate comprising glass having evaporated thereon a 600 A. layer of chromium. The resulting element and a control photomask element having a photopolymer without a silane therein were exposed through a high contrast transparency for 8 seconds to a PEK 500-watt mercury-high pressure arc at a distance of 25 inches. After exposure, the polyethylene terephthalate supports were peeled off and discarded leaving the exposed resists adherent to the chromium surfaces of the glass substrates. The exposed elements were then developed by placing them in a 90% tetrachloroethylene and 10% isobutanol solution for 30 seconds. This step left the resist on the chromium surfaces of the substrates in the pattern of the clear areas of the exposing transparency with no resist in the complementary opaque areas. The exposed chromium was then etched away by swabbing the surface with a 3 parts 12 N NaOH and 1 part 4 N $K_3Fe(CN)_6$ solution. When the resists were stripped from the chrome, reverse images of the original image were obtained. The element wherein the polymeric silane had been was clear and had excellent adherence to the substrate. In the instance of the control adherence was satisfactory, but undercutting was evident.

EXAMPLE XXXVII

A solution similar to that of and prepared in the same manner disclosed in Example XXXIII comprised the following ingredients:

| Ingredients: | Amount, g. |
|---|---|
| Poly(methyl methacrylate) low M.W. | 578 |
| Poly(methyl methacrylate) high M.W. | 220 |
| Terpolymer of 88 parts of methyl methacrylate/9 parts $\gamma$ - methacryloxypropyltrimethoxy silane and 11 parts acrylonitrile | 95 |
| Trimethylolpropane triacrylate | 835 |
| Triethyleneglycol diacetate | 135 |
| 2-o-chlorophenyl - 4,5 - diphenyl-imidazolyl dimer | 24 |
| 7-diethylamino-4-methylcoumarin | 9.0 |
| 2-mercaptobenzothiazole | 9.0 |
| Methanol | 1,000.0 |
| Methylene chloride to make 10,000 g. | |

This solution was coated onto 0.001 inch polyethylene terephthalate and was allowed to dry to give a layer thickness of about 0.0005 inch which had an optical density of .53 at 364 nm. The coated material was then laminated at 120° C. to an alumina wafer coated with an alloy of 20 percent platinum and 80% gold. The element was then exposed for 3 seconds through a high-contrast transparency to light from a 500-watt mercury arc at a distance of 16 inches.

Following exposure, the polyethylene terephthalate film was stripped and the remaining element was developed in methyl chloroform to remove the photopolymer in the unexposed areas. The resulting element was then baked for 1 minute at 125° C., and the alloy surface of the alumina support was etched therefrom in the area free of the protective resist by treating the same with a solution containing 3 parts of hydrochloric acid, 1 part of nitric acid, and 1 part of water. The etched relief image obtained therefrom had good resistance to aqua regia and excellent adhesion to the noble metal alloy surface of the support.

EXAMPLE XXXVIII

An additional quantity of a methylmethacrylate, γ-methacryloxypropyltrimethoxy silane and acrylonitrile free-radical polymer was prepared in the manner described in Example XXXIII to evaluate use of the same, as an adhesion promoter, when applied to a various photopolymer solution comprising the following:

| Ingredients | Solutions and amounts in grams A | B | C | D |
|---|---|---|---|---|
| Poly(methyl methacrylate) low M.W. | 5.4 | 5.4 | 5.4 | 5.4 |
| Poly(methyl methacrylate high M.W. | 2.6 | 2.6 | 2.6 | 2.6 |
| Terpolymer of 88 parts methyl methacryloxypropyl/9 parts γ-methacryloxypropyltrimethoxy silane and 11 parts acrylonitrile | 1.0 | 1.0 | 1.0 | 1.0 |
| Pentaerythritol triacrylate | 8.3 | | | |
| Triethylene glycol diacrylate | | 8.3 | | |
| Poly(propylene) glycol triacrylate | | | 8.3 | |
| Trimethylopropane trimethacrylate | | | | 8.3 |
| Triethylene glycol diacetate | 1.3 | 1.3 | 1.3 | 1.3 |
| 4,4'-Bis(dimethylamino)-benzophenone | .2 | .2 | .2 | .2 |
| Benzophenone | .2 | .2 | .2 | .2 |
| Methanol | 10.0 | 10.0 | 10.0 | 10.0 |
| Methylene dichloride to make | 100.0 | 100.0 | 100.0 | 100.0 |

The photopolymerizable solutions and respective controls comprising similar compositions without a terpolymeric silane, each were coated onto polyethylene terephthalate laminated onto silicon wafers, and processed as set forth in Example II. The sample showed greater adherence of the remaining resist to the boron doped surfaces of the silicon wafers, in addition, good image formation and etch resistance resulted, whereas, in the controls, undercutting occured.

EXAMPLE XIL

Sufficient quantities of photopolymerizable resist solutions having similar ingredients, but various monomers, in addition to a small amount of a free-radical terpolymeric silane were prepared to evaluate adhesion of the same, when laminated onto a glass support. Said terpolymeric silane was similar to that of and prepared in the manner disclosed in Example XXXIII. Said resist solutions were prepared in the manner described in Example IV and compositions were as follows:

| Ingredients | Amount (grams) and sample A | B | C | D | E |
|---|---|---|---|---|---|
| Terpolymer of 88 parts of methyl methacrylate/9 parts γ-methacryloxypropyltrimethoxy silane and 11 parts of acylonitrile | 0.5 | 0.5 | 0.5 | 0.5 | 0.5 |
| Poly(vinyl acetate viscosity in benzene=13.5-16.5 cps | 5.0 | | | | |
| Poly(vinyl chlorideacetate) viscosity of 28% solids in acetone=200 cps | | 5.0 | | | |
| Poly(vinyl chloride-acrylonitrile) viscosity of 20% solids in methylethyl ketone=80 cps | | | 5.0 | | |
| Cellulose acetate butyrate | | | | 5.0 | |
| Chlorinated rubber | | | | | 5.0 |
| Triethylene glycol diacetate | 1.0 | 1.0 | 1.0 | 1.0 | 1.0 |
| Trimethylolpropane triacrylate | 3.0 | 3.0 | 3.0 | 3.0 | 3.0 |
| Ethanol (95%) | 1.0 | 1.0 | 1.0 | 1.0 | 1.0 |
| Benzophenone | 0.1 | 0.1 | 0.1 | 0.1 | 0.1 |
| 4,4'-bis(dimethylamino)benzophenone | 0.1 | 0.1 | 0.1 | 0.1 | 0.1 |
| Methylethyl ketone | 45.0 | 45.0 | 45.0 | 45.0 | 45.0 |

The solutions and respective controls of which the terpolymer had been omitted were coated with a 0.002-inch knife on .00075-inch polyethylene terephthalate to a dry thickness of 0.00035-inch, glass slides were applied at 110° C., and the slides were cooled to room temperature. The resultant composite elements were then exposed through a high-contrast transparency image for 5 seconds to a Sylvania Sungun 56–60 model at a distance of 16 inches. After exposure, the polyethylene terephthalate support films were peeled off and discarded, leaving the various exposed resists adherent to the glass slides. The elements were then developed with a 20-second spray of methylchloroform followed by a 30-second spray of water to remove the unexposed areas. The glass of the resultant image-bearing elements were then etched with a buffered hydrofluoric acid solution.

The resist compositions having the silane terpolymer therein remained well adhered to the glass, whereas, the controls were delaminated.

EXAMPLE L

Using sufficient quantities of compositions C and D, additional composite elements having copper supports in place of the glass of Example XIL were prepared and exposed in accordance with the methods of said example. Developing and etching operations were repeated, but in this instance, the image-bearing elements were etched for 4 minutes in a ferric chloride solution at 140° F. Unlike the samples having the silane terpolymer incorporated in the resist, the controls showed severe undercutting.

The embodiments of the invention in which an exclusive property or privilege is claimed are defined as follows:

1. A photopolymerizable, resist-forming element comprising a flexible polymeric film support and a layer comprising an intimate mixture of (a) at least one macromolecular organic polymer binder in an amount of 10 to 90 parts, by weight, (b) at least one addition polymerizable monomer containing at least two terminal ethylenically unsaturated groups in an amount of 90–10 parts, by weight, and (c) an initiating amount of an addition polymerization initiator, characterized by the presence initially of 0.5–15%, by weight, of the total weight of the constituents of at least one monomeric or polymeric organosilane, said support being strippable from said layer after the lamination of said layer with said support to a substrate comprising a metal, glass, silicon or ceramic surface.

2. An element according to claim 1 wherein the binder is a poly(alkyl acrylate) or a poly(alkyl methacrylate) wherein alkyl is methyl or ethyl, and is solid at 50° C.

3. An element according to claim 1, wherein constituent (b) is pentaerythritol triacrylate.

4. An element according to claim 1, wherein constituent (b) is triethylene glycol triacrylate.

5. An element according to claim 1 wherein constituent (b) is trimethylolpropane triacrylate.

6. An element according to claim 1 wherein constituent (b) is trimethylolpropane triacrylate, and triethyleneglycol diacetate is present.

7. An element according to claim 1 wherein the organosilane is a polymeric condensed silane.

8. An element according to claim 1 wherein the organosilane is gamma-glycidoxypropyltrimethoxysilane.

9. An element according to claim 1 wherein the organosilane is gamma-aminopropyltriethoxysilane.

10. An element according to claim 1 wherein said support is a copper coated polymer sheet.

References Cited

UNITED STATES PATENTS

| | | | |
|---|---|---|---|
| 3,520,683 | 7/1970 | Kerwin | 96—35.1 |
| 3,615,538 | 10/1971 | Peters | 96—115 R |
| 3,405,017 | 10/1968 | Gee | 156—17 |
| 3,398,210 | 8/1968 | Plueddemann et al. | 260—827 |
| 3,469,982 | 9/1969 | Celeste | 96—35.1 |
| 2,760,863 | 8/1956 | Plambeck | 96—115 |
| 3,547,651 | 12/1970 | Roos | 96—115 |
| 3,482,977 | 12/1969 | Baker | 96—36.2 |
| 3,549,368 | 12/1970 | Collins et al. | 96—35.1 |
| 2,991,204 | 7/1961 | Astle | 148—6 |

RONALD H. SMITH, Primary Examiner

U.S. Cl. X.R.

96—35.1, 36.2, 86 P, 87 R, 115 R